United States Patent
Yeh et al.

(10) Patent No.: US 7,727,900 B2
(45) Date of Patent: Jun. 1, 2010

(54) SURFACE PREPARATION FOR GATE OXIDE FORMATION THAT AVOIDS CHEMICAL OXIDE FORMATION

(75) Inventors: Matt Yeh, Hsinchun (TW); Shun Wu Lin, Taichung (TW); Chi-Chun Chen, Kaohsiung (TW); Shih-Chang Chen, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 527 days.

(21) Appl. No.: 11/358,624

(22) Filed: Feb. 21, 2006

(65) Prior Publication Data

US 2007/0197037 A1   Aug. 23, 2007

(51) Int. Cl.
*H01L 21/302* (2006.01)
*H01L 21/461* (2006.01)

(52) U.S. Cl. ............... 438/750; 438/756; 257/E21.219

(58) Field of Classification Search ................ 438/704, 438/770, 906, 689, FOR. 110, 749–751, 756; 134/1.3; 257/E21.214, E21.215, E21.219
See application file for complete search history.

(56) References Cited

U.S. PATENT DOCUMENTS

| | | | |
|---|---|---|---|
| 6,032,682 A * | 3/2000 | Verhaverbeke | 134/1.3 |
| 6,230,720 B1 * | 5/2001 | Yalamanchili et al. | 134/1.3 |
| 6,232,241 B1 | 5/2001 | Yu et al. | |
| 6,586,293 B1 * | 7/2003 | Hasegawa | 438/216 |
| 2004/0000322 A1 * | 1/2004 | Verhaverbeke | 134/1.3 |
| 2007/0161248 A1 * | 7/2007 | Christenson et al. | 438/689 |

* cited by examiner

*Primary Examiner*—Matthew Smith
*Assistant Examiner*—Quovaunda Jefferson
(74) *Attorney, Agent, or Firm*—Duane Morris LLP

(57) ABSTRACT

A cleaning sequence usable in semiconductor manufacturing efficiently cleans semiconductor substrates while preventing chemical oxide formation thereon. The sequence includes the sequence of: 1) treating with an HF solution; 2) treating with pure $H_2SO_4$; 3) treating with an $H_2O_2$ solution; 4) a DI water rinse; and 5) treatment with an HCl solution. The pure $H_2SO_4$ solution may include an $H_2SO_4$ concentration of about ninety-eight percent (98%) or greater. After the HCl solution treatment, the cleaned surface may be a silicon surface that is free of a chemical oxide having a thickness of 5 angstroms or greater. The invention finds particular advantage in semiconductor devices that utilize multiple gate oxide thicknesses.

18 Claims, 4 Drawing Sheets

SURFACE PREPARATION FOR GATE OXIDE FORMATION THAT AVOIDS CHEMICAL OXIDE FORMATION

FIELD OF THE INVENTION

The present invention relates, most generally, to semiconductor devices and methods for forming the same. More particularly, the present invention is directed to a sequence used to clean and prepare a semiconductor substrate while minimizing chemical oxide formation.

BACKGROUND

In the sub-micron era of today's rapidly emerging semiconductor manufacturing industry, gate oxide thicknesses are scaled down to the range of 10-20 angstroms. It is therefore critically essential to maintain gate oxides at their intended thicknesses, since any variation in thickness will be a significant one in such thickness range.

In addition to utilizing reduced gate oxide thicknesses, many semiconductor devices are designed to include two or more gate oxide thicknesses. For example, integrated circuit driver devices typically include high voltage and low voltage regions and use at least three operating voltages. The different operating voltages are used for different device types formed on the substrate and the different operating voltages are associated with gate oxide thicknesses that differ according to the operating voltage. A challenge in semiconductor manufacturing technology is to form multiple gate oxides of various thicknesses on the same substrate, then to define and form associated devices using the various gate oxides, while preserving the integrity of the gate oxides and maintaining correct gate oxide thicknesses by preventing the formation of chemical or other gate oxides during cleaning or other operations.

Wet etching procedures are typically used to remove the gate oxide from exposed areas not covered by photoresist, so that a further gate oxide having a different thickness can be subsequently formed in the exposed areas to produce the multiple gate oxide thickness effect. In some devices, this process may be repeated so that a photoresist pattern is also formed over portions of two different gate oxide thicknesses to remove the oxide from the exposed areas and subsequently form a third gate oxide. It can be appreciated that the oxides must be completely removed from the exposed areas if the subsequently formed gate oxide is to have a desired thickness in the range discussed above.

According to conventional technology for forming multiple gate oxide thicknesses, an oxide is grown, and a photoresist pattern formed over the oxide. The oxide is etched in areas not covered by the photoresist pattern using DHF (dilute HF) or BHF (buffered HF). The photoresist is then stripped using an SPM solution then a two-step, RCA clean using $NH_3$ and $H_2O_2$ is used to clean the etched areas prior to the formation of a second, thinner oxide in the exposed areas. Using conventional technology, however, a chemical oxide forms on the silicon surface after the etching operation and during the cleaning operations. The chemical oxide is an oxide that forms on silicon surfaces during wet cleaning and rinsing operations and is highly hydrated, having a composition that differs from stoichiometric $SiO_2$ and may be represented by $SiO_x$, with x<2. Such chemical oxides can undesirably grow to thicknesses of 10 angstroms and greater and this compromises the ability to form gate oxides having targeted thicknesses in the 10-20 angstrom range.

One attempt to subvert the growth of the chemical oxide is to add a final HF process but the addition of an HF-final process carries with it the shortcomings of high particle counts, watermarks formed on the substrate, and organic residue. Another approach is to replace the RCA clean with the SPM cleaning solution, an $H_2SO_4$:$H_2O_2$ mixture typically in a 1:4 ratio. The use of the SPM solution, however, degrades gate oxide integrity and potentially damages the silicon surface.

As such, there is a need to provide a cleaning operation that addresses the above shortcomings and provides an efficient and fast cleaning method that strips photoresist and cleans an etched surface without the undesirable formation of a thick chemical oxide. The present invention addresses these and other needs.

SUMMARY OF THE INVENTION

To address these and other needs and in view of its purposes, the present invention provides a wet cleaning sequence that suppresses oxide growth when performed on a semiconductor device formed on a semiconductor substrate. The wet cleaning sequence includes first treating with a solution of HF, then treating with a solution of substantially pure $H_2SO_4$, then treating with a solution of $H_2O_2$, then treating with DI water, then treating with an HCl solution. One aspect of the invention is the use of the aforementioned process sequence in the fabrication of dual or multiple gate oxide devices.

According to another aspect, the present invention provides a method for suppressing oxide growth while performing a wet cleaning operation on a semiconductor device formed on a semiconductor substrate. The method comprises a one stage cleaning process sequence that takes place in the same tool. The sequence consists of providing a substrate with a gate oxide thereon and a photoresist pattern thereover, etching exposed portions of the gate oxide and cleaning by first treating with a pure $H_2SO_4$ solution then cleaning with an $H_2O_2$ solution.

BRIEF DESCRIPTION OF THE DRAWING

The present invention is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

DETAILED DESCRIPTION

Figure 1:
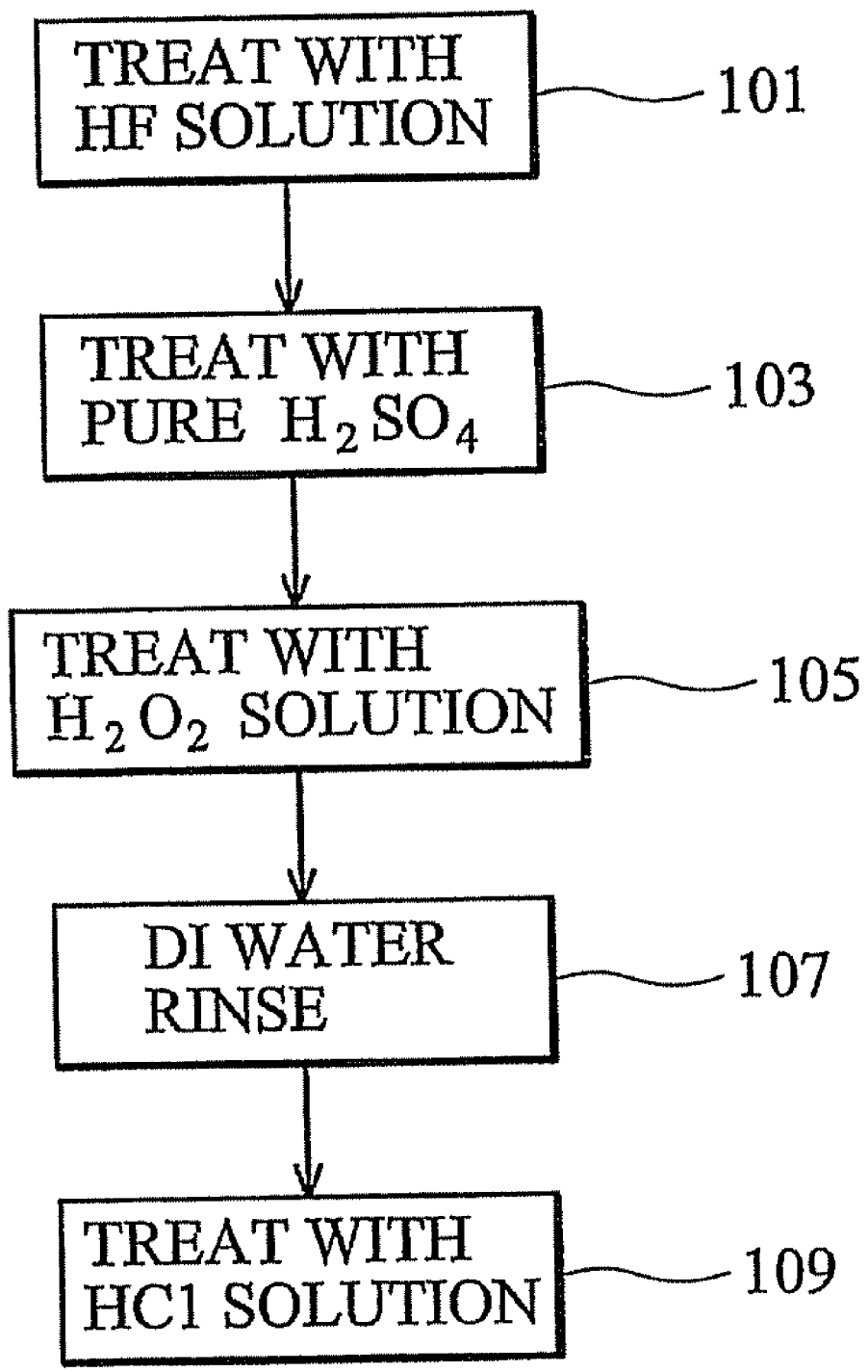
FIG. 1 is a flow chart showing an exemplary process sequence of the invention.

FIG. 1 is a flow chart showing a sequence of cleaning operations according to the invention. FIG. 1 illustrates the following sequence of process operations that may advantageously be performed on a semiconductor device formed on a semiconductor substrate: 1) treat with HF solution 101; 2) treat with pure $H_2SO_4$ (sulfuric acid) 103; 3) treat with $H_2O_2$ (hydrogen peroxide) solution 105; 4) rinse in DI water 107;

and 5) treat with HCl (hydrochloric acid) solution 109. The sequence of steps 101, 103, 105, 107 and 109 may be a one stage operation sequence, i.e. one that takes place in the same processing tool. The sequence of process operations may take place in many commercially available automated wet processing tools in which the substrates that undergo the processing sequence are static, or other suitable systems in which the substrates are rotated or otherwise moved during processing. The substrates may remain in a single chamber or be moved from chamber to chamber within the tool. Various methods may be used to direct the cleaning solutions to the substrate surface or vice versa, and various liquid flow rates may be used. Liquid jets may be used to direct the solution to the surfaces in one exemplary embodiment, and in another exemplary embodiment, the substrate or plurality of substrates may be submerged in a solution. In one exemplary embodiment, the sequence of operations may take place in a single bath in a conventionally available wet bench. Temperatures of 25° C. to 180° C. may be advantageously utilized for the sequence of operations but various other suitable temperatures may be used for the sequence of operations.

The HF solution treatment, step 101, may be carried out using solutions with various HF concentrations. HF concentrations of 1:50, 1:100, 1:200, 1:300, and 1:500 are commonly available and may be used but other HF concentrations may be used in other exemplary embodiments. By "pure $H_2SO_4$", it is meant that the sulfuric acid solution contains no other chemicals. Generally, the concentration of the $H_2SO_4$ may be around 98% or higher, but other $H_2SO_4$ concentrations may be used in other exemplary embodiments.

Peroxides of various strengths may be used in the $H_2O_2$ solution treatment, step 105, which is a cleaning operation that removes sulfate residue.

In one exemplary embodiment, the DI water rinse operation, step 107, may be a nano-spray operation, i.e. a high pressure gas stream that additionally provides a physical force for the removal of particles from a surface. Nitrogen or other suitable gases may be used. Nitrogen may additionally be used as a carrier medium gas according to embodiments in which the other process operations 101, 103, 105 and/or 109 take place by using a gas to direct the chemical solution to the substrate surface.

The HCl solution used in step 109 may include various HCl concentrations such as, but not limited to 1:50, 1:75, 1:100, and 1:150. The use of the HCl step avoids watermark defects and organic contamination associated with the use of an 'HF-final' process sequence. Gate oxide integrity is maintained due to the use of the DI water/HCl steps.

One aspect of the aforementioned sequence of operations used to clean a semiconductor substrate includes the suppression of chemical oxide growth on exposed areas such as silicon areas. As such, the cleaning sequence is advantageously utilized in the sequence of process operations used to form multiple gate oxides, however, the cleaning sequence may be used at various other stages in the manufacture of semiconductor devices.

Figure 2A:
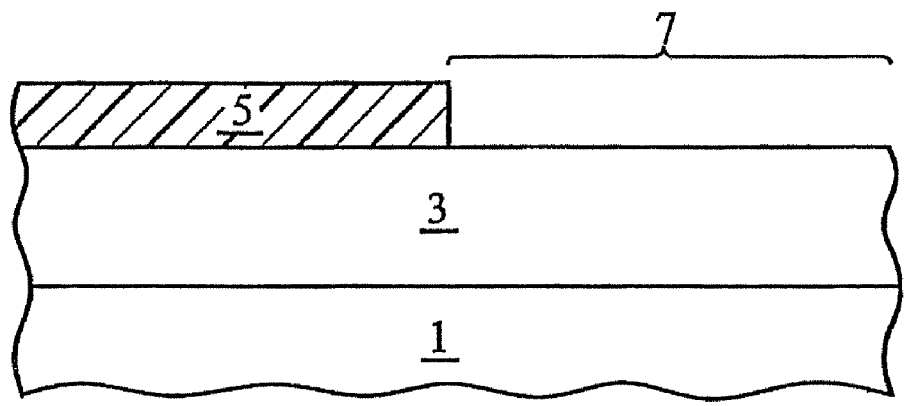
FIGS. 2A-2D are cross-sectional views that show an exemplary process sequence performed on a semiconductor device according to one embodiment of the invention.

According to one aspect, the aforementioned process sequence may be used to etch a patterned oxide film, remove the patterning material, then clean the substrate. The sequence may find particular advantage when a device having multiple gate oxides is being manufactured, in particular after a first gate oxide has been formed and a pattern formed thereover. FIG. 2A shows oxide film 3 formed over substrate 1. Substrate 1 may be formed of silicon or other suitable substrate materials used in semiconductor manufacturing. Oxide 3 may be a gate oxide and may includes various thicknesses. When used in the sub-micron era, i.e., 45 nm-32 nm gates, oxide 3 may be a gate oxide having a thickness as low as in the 15 angstrom range. Photoresist pattern 5 is formed over oxide film 3 and may be formed using conventional methods. Exposed portion 7 will be subjected to an etching operation since it is not covered by photoresist pattern 5.

Figure 2B:
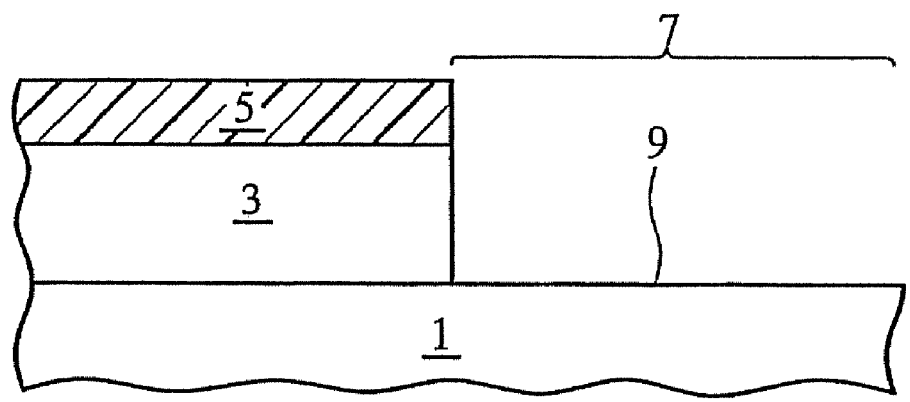
Figure 2C:
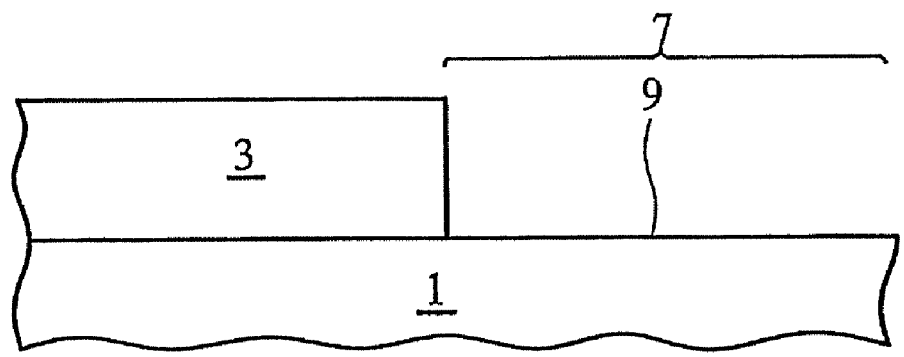
Figure 2D:
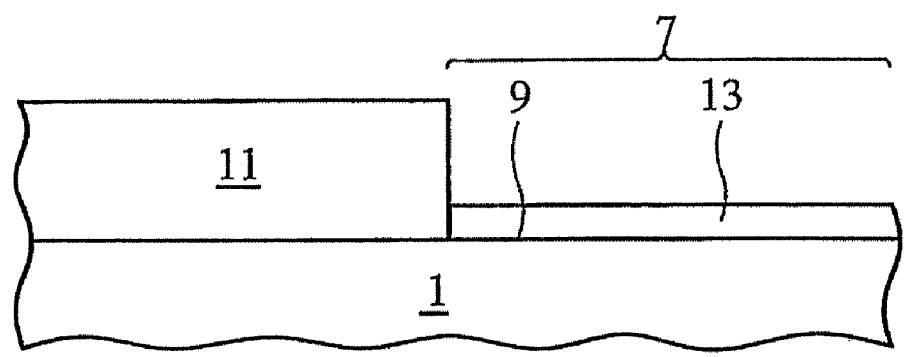

FIG. 2B shows the structure after oxide film 3 has been removed from exposed area 7 by etching. The HF solution treatment, such as illustrated at step 101 of the process sequence illustrated in FIG. 1, may be used to etch the oxide but other etchants may be used in other exemplary embodiments. Oxide 3 is removed to expose surface 9 which may be oxidation-prone silicon, in one exemplary embodiment. The process sequence illustrated in FIG. 1 then continues and the structure in FIG. 2C results after treatment in pure $H_2SO_4$ then treatment with an $H_2O_2$ solution followed by a DI water rinse and treatment in HCl solution. The $H_2SO_4/H_2O_2$ sequence essentially removes patterned photoresist 5 and cleans the substrate. The following DI rinse and HCl treatment further clean the substrate. The process operations are as described above. It is an advantage of the invention that, after the treatment with HCl solution, step 109, surface 9 of FIG. 2C is substantially free of chemical oxides. In one embodiment, surface 9 is free of a chemical oxide having a thickness of 5 angstroms or greater. After formation of the structure in FIG. 2C which includes no chemical oxide or only an ultra-thin chemical oxide on surface 9, a further oxide may be formed such as shown in FIG. 2D. FIG. 2D shows a further oxide film 13 formed over substrate 1. Thermal or other conventional methods may be used to form oxide film 13 and will generally increase the thickness of oxide film 3 to produce thicker oxide film 11. In the illustrated embodiment, thicker oxide film 11 may be a first gate oxide being thicker than oxide film 13 which may be a second gate oxide, but other arrangements may be used in other exemplary embodiments.

Figure 3A:
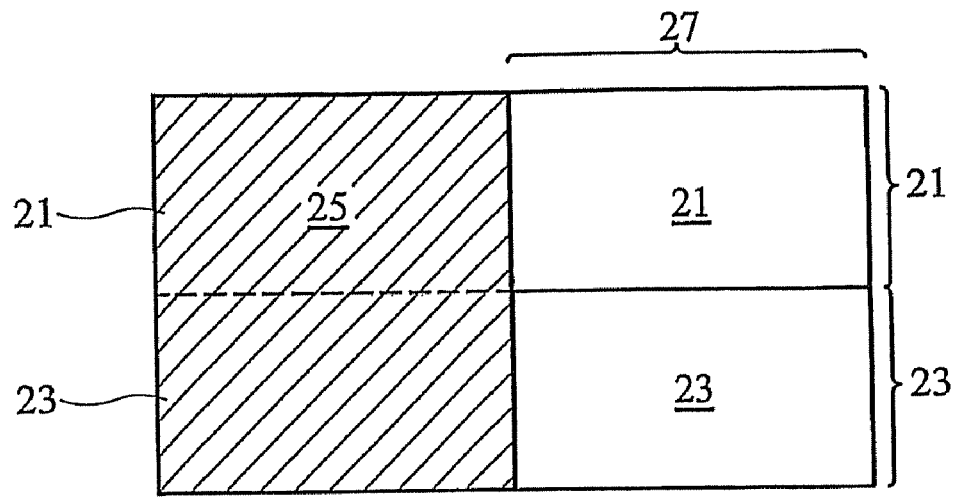
FIGS. 3A and 3B are top views showing an exemplary process sequence performed on a semiconductor device according to an exemplary embodiment of the invention.
Figure 3B:
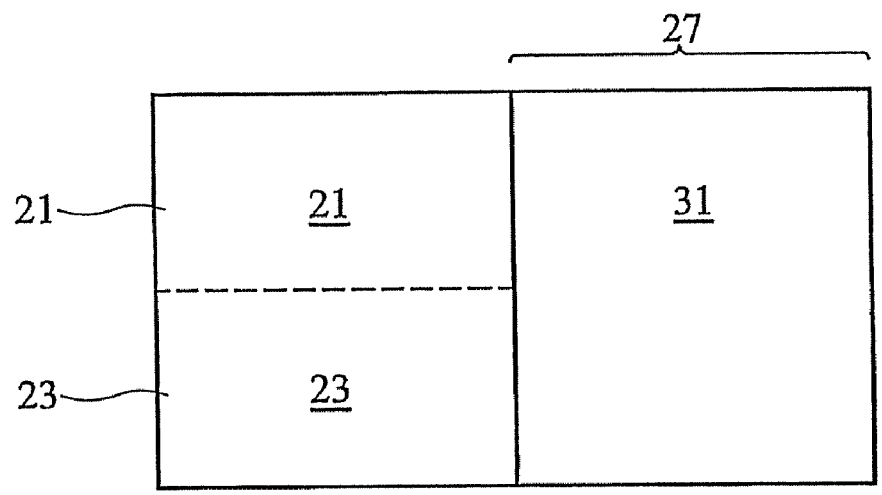

According to another exemplary embodiment of the invention, a substrate already having multiple gate oxides thereon may be further patterned and etched to remove the existing oxides in sections in which yet another gate oxide is to be formed. FIGS. 3A and 3B illustrate such a sequence.

FIG. 3A shows a section of a substrate including first gate oxide 21 and second gate oxide 23. The first 21 and second 23 gate oxides may have different thicknesses. Photoresist pattern 25 is formed over sections of first gate oxide 21 and second gate oxide 23, whereas exposed section 27 is not covered by photoresist pattern 25. The above-described sequence of processing operations is then used to etch both first oxide 21 and second oxide 23 from exposed sections 27 not protected by photoresist pattern 25. The process sequence also removes photoresist 25 and cleans the surfaces to produce the structure shown in FIG. 3B which includes first gate oxide 21 and second gate oxide 23. Exposed section 27 includes surface 31 which may be silicon or other materials. It is an aspect of the invention that, after the treatment with HCl solution, illustrated as step 109 in FIG. 1, surface 31 is substantially free of chemical oxides, in particular it is free of chemical oxides having a thickness of 5 angstroms or greater. Subsequent oxide formation operations are then advantageously carried out to produce a third gate oxide in exposed area 27 and this oxide formation operation may increase the thickness of first gate oxide 21 and second gate oxide 23. In this manner, the substrate may then include three gate oxides, each having a different thickness: first gate oxide 21, second gate oxide 23, and a third gate oxide formed on surface 31 in exposed area 27.

In one exemplary embodiment, the patterning, etching and cleaning sequence may be repeated after the formation of a further photoresist pattern on at least portions of the three oxides to produce an exposed area upon which yet another oxide may be formed, such as may be used as a fourth gate oxide. It is an aspect of the invention that, after each etching operation used to remove the existing oxide layer, the cleaning operation renders the exposed silicon surface substantially free of chemical oxide, i.e., absolutely free of chemical oxide or having an ultra-thin chemical oxide of 5 angstroms or less. In this manner, subsequent gate oxides having thicknesses in the range of 10-100 angstroms such as used in the submicron era, may be formed to accurate thicknesses.

The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method for suppressing oxide growth while performing a wet cleaning sequence on a semiconductor device on a semiconductor substrate, said method comprising a sequence of:
    treating with a solution of HF then treating with a solution of substantially pure $H_2SO_4$ then treating with a solution of $H_2O_2$ then treating with DI water then treating with an HCl solution.

2. The method as in claim 1, wherein each of said treating with a solution of HF, said treating with a solution of substantially pure $H_2SO_4$, said treating with a solution of $H_2O_2$, said treating with DI water and said treating with an HCl solution take place in the same chamber of a process tool.

3. The method as in claim 1, wherein each of said treating with a solution of HF, said treating with a solution of substantially pure $H_2SO_4$, said treating with a solution of $H_2O_2$, said treating with DI water and said treating with an HCl solution are successive operations carried out in a single bath.

4. The method as in claim 1, further comprising, prior to said treating with a solution of HF, providing said semiconductor substrate with an oxide thereon and a photoresist pattern thereover, and wherein said treating with a solution of HF comprises etching said oxide in exposed areas not covered by said photoresist pattern.

5. The method as in claim 4, wherein, after said treating with an HCl solution, said exposed areas are silicon surfaces free of a chemical oxide having a thickness of 5 angstroms or greater thereon.

6. The method as in claim 4, wherein said treating with a solution of substantially pure H2SO4 then treating with a solution of H2O2 removes said photoresist pattern.

7. The method as in claim 4, wherein said oxide comprises a first gate oxide, said exposed areas comprise silicon surfaces, and further comprising forming a second gate oxide in said exposed areas after said treating with an HCl solution, said first gate oxide having a thickness greater than said second gate oxide.

8. The method as in claim 7, further comprising, after said forming a second gate oxide, forming a second photoresist pattern over portions of said first gate oxide and said second gate oxide, then repeating said sequence.

9. The method as in claim 1, wherein said treating with DI water comprises introducing said DI water to said substrate in a high pressure gas stream.

10. The method as in claim 1, wherein said HCl solution includes a concentration within a range of 1:50 to 1:150.

11. The method as in claim 1, wherein said solution of HF includes an HF concentration within a range of 1:50 to 1:500.

12. The method as in claim 1, wherein said substantially pure $H_2SO_4$ includes an $H_2SO_4$ concentration of around at least 98%.

13. The method as in claim 1, wherein said semiconductor device includes first and second gate oxides on said substrate, said first gate oxide having a greater thickness than said second gate oxide, and further comprising, prior to said treating with a solution of HF, forming a photoresist pattern over said semiconductor device and wherein said treating with a solution of HF comprises etching said first gate oxide and said second gate oxide in exposed areas not covered by said photoresist pattern.

14. The method as in claim 13, wherein, said exposed areas comprise silicon surfaces and after said treating with an HCl solution, said silicon surfaces are free of a chemical oxide having a thickness of 5 angstroms or greater, and
    further comprising forming a third gate oxide in said exposed areas, said third gate oxide having a thickness different than said first oxide thickness and said second oxide thickness.

15. A method for suppressing oxide growth while performing a wet cleaning operation on a semiconductor device formed on a semiconductor substrate, said method comprising a one stage cleaning process sequence that takes place in the same tool, said method comprising:
    providing a substrate with an oxide thereon and a photoresist pattern thereover;
    performing said one stage cleaning process sequence comprising:
    etching exposed portions of said oxide; and
    cleaning by first treating with a pure $H_2SO_4$ solution then cleaning with an $H_2O_2$ solution.

16. The method as in claim 15, wherein said pure $H_2SO_4$ solution includes an $H_2SO_4$ concentration of around at least 98% and said etching comprises etching with an HF solution.

17. The method as in claim 15, further comprising performing a sequence of a DI water rinsing then treating with an HCl solution, following said cleaning with an $H_2O_2$ solution.

18. The method as in claim 17, wherein, said substrate is formed of silicon, said etching exposes silicon surfaces and, after said cleaning with an HCl solution, said silicon surfaces are free of a chemical oxide having a thickness of 5 angstroms or greater thereon.

* * * * *